United States Patent [19]
Takechi et al.

[11] Patent Number: 6,050,827
[45] Date of Patent: *Apr. 18, 2000

[54] METHOD OF MANUFACTURING A THIN-FILM TRANSISTOR WITH REINFORCED DRAIN AND SOURCE ELECTRODES

[75] Inventors: Sadatoshi Takechi, Kagawa; Tadanori Hishida; Fumiaki Funada, both of Nara, all of Japan

[73] Assignee: Sharp Kabushiki Kaishi, Osaka, Japan

[ * ] Notice: This patent is subject to a terminal disclaimer.

[21] Appl. No.: 08/004,661

[22] Filed: Jan. 14, 1993

Related U.S. Application Data

[63] Continuation of application No. 07/768,474, Sep. 30, 1991, abandoned, which is a continuation of application No. 07/542,789, Jun. 26, 1990, abandoned, which is a continuation of application No. 07/291,590, Dec. 29, 1988, abandoned, which is a continuation of application No. 06/566,882, Dec. 29, 1983, abandoned.

[30]  Foreign Application Priority Data

Dec. 29, 1982 [JP] Japan ................................. 82-230979

[51] Int. Cl.[7] .................................................. H01L 21/336
[52] U.S. Cl. ........................... 437/40; 437/189; 437/944; 257/42
[58] Field of Search ............................... 437/40, 41, 189, 437/245; 257/42

[56] References Cited

FOREIGN PATENT DOCUMENTS

| 0005577 | 1/1986 | Japan | 357/23.7 |
|---|---|---|---|
| 0001072 | 1/1988 | Japan | 357/23.7 |
| 0219174 | 9/1988 | Japan | 357/23.7 |
| 0191479 | 8/1989 | Japan | 357/23.7 |

*Primary Examiner*—Mary Wilczewski
*Attorney, Agent, or Firm*—Staas & Halsey

[57] ABSTRACT

A thin film transistor where source and drain electrodes are film laminates including at least two layers. A first layer film of the laminate, which is formed to a thickness of 10 to 700 Å is in ohmic contact with underlying semiconductor film. A second layer film, formed on the first layer film has a thickness of more than about 2000 Å and is a material having a sufficient adhesion strength even when formed at a temperature which is less than the temperature corresponding to the materials vapor pressure. Further, the materials used for the source and drain electrodes can be formed into thin films by ordinary sputtering or vacuum deposition techniques, low in cost, and readily available. A thin film transistor according to the present invention is formed on a substrate by the steps of: forming a gate electrode on the substrate; oxidizing the gate electrode to form a gate insulating film, the gate electrode and the gate insulating film forming a step; forming a thin film semiconductor on the gate insulating film; forming a first layer film portion of a source and drain electrode film laminate on the thin film semiconductor and in ohmic contact with the thin film semiconductor; and forming a second layer film portion of the source and drain electrode film laminate, the second layer film being an adhesion layer, convering the first layer film, and having a sufficient thickness to provide a continuous film across the step.

8 Claims, 5 Drawing Sheets

METHOD OF MANUFACTURING A THIN-FILM TRANSISTOR WITH REINFORCED DRAIN AND SOURCE ELECTRODES

This application is a continuation of application Ser. No. 07/768,474, filed on Sep. 30 1991 now abandoned which is a continuation of application Ser. No. 07/542,789, filed on Jun. 26, 1990, now abandoned which is a continuation of application Ser. No. 07/291,590 filed on Dec. 29, 1988, now abandoned, which is a continuation of application Ser. No. 566,882 filed on Dec. 29, 1983, now abandoned.

BACKGROUND OF THE INVENTION

A. Field of the Invention

This invention relates to a thin film transistor and, more particularly, to an improvement of an electrode structure of a thin film transistor (hereinafter referred to as a "TFT"), and the process of making the TFT.

Thin film transistors are advantageous in many circumstances. For example, when TFTs are added to a liquid crystal display unit having electrodes arranged in matrix form or to an electroluminescence panel, the display capacity is increased thereby improving the quality of the display, and the peripheral drive circuitry can be simplified. Thin film transistors have not been put in practical use as yet because the manufacturing process for TFTs is technically difficult and TFTs are still not sufficiently reliable and stable.

A TFT has a thin film structure in which a source electrode and a drain electrode are formed on a semiconductor film layer, and an insulating film is formed if necessary. The required characteristics of source and drain electrode materials are as follows:

(1) The source and drain electrode materials should be in ohmic contact with the semiconductor film. This condition is essential for the source and drain electrode materials of the transistors. If ohmic contact is not achieved a voltage drop occurs at the contact region between the source and drain electrodes and the semiconductor, and, the output voltage is decreased. To prevent a decrease in the output voltage it is necessary to increase the driving voltage by an amount equal to the voltage drop across the contact region. When the driving voltage is increased the gate voltage increases proportionally and the reliability of the TFT is lowered.

(2) The electrode materials should be thin film materials which adhere to the semiconductor and the substrate. If the adhesion force of the source and drain electrode film is weak, the film may come off either during or after formation of the film or during source and drain electrode pattern removal. The adhesion strength of such a film can be increased by various pretreatment methods, for example by cleaning the surface of the substrate by exposing it to plasma discharge or by a variety of film forming methods, for example, forming the film by ion plating. The most commonly employed method is to increase the temperature of the substrate during formation of the film. This method is advantageous because increasing the temperature of the substrate removes any gas and/or moisture from the surface of the substrate., thereby, cleaning it, and accelerating the chemical binding of the film material to the substrate. The temperature to which the substrate can be heated is limited by the type of semiconductor film and the source and drain electrode pattern forming method. The temperature limitation is applicable when the semiconductor is a material such as tellurium (Te) or cadmium sulfide (CdS) having a relatively high vapor pressure and when the source and drain electrode pattern forming method is a lift-off method using a resist mask. In general, the substrate should be heated to 200° C. to 250° C. or higher in order to increase the force of adhesion. However,if a semiconductor material which has a high vapor pressure is heated to a certain temperature the semiconductor film will evaporate. If the substrate temperature is too high when using resist masks and the lift-off method, the amount of gas discharged from the resist is increased causing an adverse affect on the film and resulting in a resist seizure phenomenon. This makes it impossible to form an electrode pattern. Accordingly, it is necessary to use a thin film material which has sufficient adhesion when the substrate is at relatively low temperature during the formation of the film (for example about 100° C.).

(3) The electrode materials should be readily available, low in cost, and such that they can be formed into films by ordinary sputtering or vacuum deposition methods. These characteristics are essential for reducing the manufacturing cost.

The source and drain electrode materials which meet the above-described three conditions are limited. For example, if tellurium (Te) is selected as the abovedescribed semiconductor film having a high vapor pressure, the source and drain electrodes preferably would be gold (Au), nickel (Ni), cobalt (Co) or indium (In) to have an ohmic contact with the tellurium (Te) semiconductor film. However, it has been demostrated through experiments that of these materials, gold and nickel provide the best results. Gold is expensive. Therefore, when the semiconductor film is made of tellurium (Te), nickel (Ni) satisfies the above-described conditions. B. Description of the Prior Art A conventional method of manufacturing a thin film transistor having a semiconductor film of Te and a source electrode film of Ni will be briefly described. FIG. 1 is one example of an electrode structure of a thin film transistor having a semiconductor film of tellurium (Te) and source and drain electrodes of nickel (Ni). A stop layer 11 for stopping the effect of etching is formed on a glass substrate 10 and is a protective film for preventing the glass substrate 10 from being etched by the etching atmosphere used to form the gate electrode. A tantalum (Ta) film (only partially shown) is formed on the stop layer 11 by sputtering or vacuum deposition. The tantalum film is then formed into a gate electrode 12 by patterning, and part of the gate electrode 12 is subjected to anodic oxidation to form a gate insulating film 13. Then, a photoresist is used to form a mask, that can be lifted off according to a desired semiconductor pattern, and Te is vacuum-deposited thereon. A semiconductor film 14 of Te is formed by removing the photoresist. In the same manner, Ni is vacuum deposited to form a source electrode 15 and a drain electrode 16. Finally, aluminum oxide ($Al_2O_3$) is vacuum deposited to form a protective film 17 which is adapted to protect the transistor from the environment. In this manner the thin film transistor element is manufactured.

If during formation of the source and drain electrodes 15 and 16 in the above-described manufacturing process, the Ni film is thin, then the formed source and drain electrodes 15A and 16A, as shown in FIG. 2(A), are discontinuous and therefore do not contact the semiconductor film 14. On the other hand, if the Ni film forming source and drain electrodes 15B and 16B is made thick enough to overcome the above-described difficulty, the Ni film may come off the substrate 10 because the Ni film will not sufficiently adhere to the substrate 10. The simplest method of increasing the strength of adhesion of the Ni film is to increase the temperature of the substrate. However, since the vapor pressure of the Te forming the semiconductor film 14 is high, and the source 15 and drain 16 electrodes are formed by the lift-off method using the photoresist, it is not possible to increase the temperature of the substrate to higher than about 100° C.

Thus, it is difficult to provide a thin film transistor having good reproducibility and stable characteristics using the above-described process.

SUMMARY OF THE INVENTION

It is an object of the present invention to provide a thin film transistor which overcomes the deficiencies of the prior art.

Another object of the present invention is to provide a thin film transistor that has high integrity drain and source electrode formed at room temperature.

A further object of the present invention is to provide a thin film transistor in which the source and drain electrodes are in ohmic contact with the semiconductor film.

Another object of the present invention is to provide a thin film transistor in which the source and drain electrode materials do not separate from the semiconductor and/or the substrate after being deposited.

An additional object of the present invention is to achieve the above objects using relatively inexpensive materials for the source and drain electrodes.

These and other objects of the present invention are accomplished by having thin film transistor where the source and drain electrodes are film laminates. A first layer film of the laminate is in ohmic contact with the underlying semiconductor film. A second layer film is formed on the first layer film and is a material having a sufficient adhesion strength even when formed at a relatively low temperature. The source and drain electrode film laminate is formed as a first layer film which is discontinuous at the step formed by the gate electrode and the gate insulating film and a second layer film, having a greater adhesion strength than the first layer film, reinforcing the first layer film, and having sufficient thickness to provide a continuous film across the step, is formed over the first layer film.

These together with other objects and advantages which will be subsequently apparent, reside in the details of construction and operation as more fully hereinafter described and claimed, reference being had to the accompanying drawings which form a part thereof, wherein like numerals refer to like parts throughout.

DESCRIPTION OF THE PREFERRED EMBODIMENT

A source and drain electrode structure according to the present invention will be now described. In the case where the adhesion strength of the source and drain electrode film is insufficient, in forming source and drain electrodes, a first layer film is formed with a material which will be in ohmic contact with the semiconductor. The first layer film should have a thickness sufficient for ohmic contact and ohmic contact should be provided before the film becomes a two-dimensionally complete film. That is, the film thickness should be such that a mesh-pattern structure remains. Generally, this first layer film should have a relatively thin average thickness which is on the order of 10 to 700 Å (Angstroms).

A second layer film is then formed which is more than 2000 Å in thickness, preferably in the range of 2000 to 10000 Å in thickness and is a material having a sufficient strength of adhesion even when formed into a film at a relatively low temperature (for example about 100° C.). Further, the temperature of the material during the deposition should be less than the temperature corresponding to the vapor pressure. Materials having a high adhesion strength are aluminum, iron, chromium, titanium, molybdenum, magnesium, tungsten, tantalum, niobium, hafnium and zirconium. The second layer film is formed on the first layer film and is further formed on the substrate through the mesh-pattern of the first layer film. The thickness of the second layer film should be such that it does not become discontinuous at the edge or step of the gate electrode. Accordingly, the second layer film prevents the discontinuity caused by the step formed by the gate electrode and also reinforces the first layer film which has a relatively weak adhesion strength. Thus, the source and drain electrodes have a larger adhesion strength and good ohmic contact as a whole.

In the above-described electrode structure, the first layer film creates a satisfactory ohmic contact with the semiconductor film and the second layer film provides a sufficiently large adhesion strength, while the discontinuity caused by the step formed by the gate electrode is prevented. If the second layer film is in barrier contact with semiconductor, the carriers flow through the ohmic contact region of the first layer film and the semiconductor. A protective film of $Al_2O_3$ is then vacuum deposited over the second layer film and the semiconductor film. Accordingly, the source and drain electrodes formed satisfy the above-described conditions for the source and drain electrode material.

Figure 1:
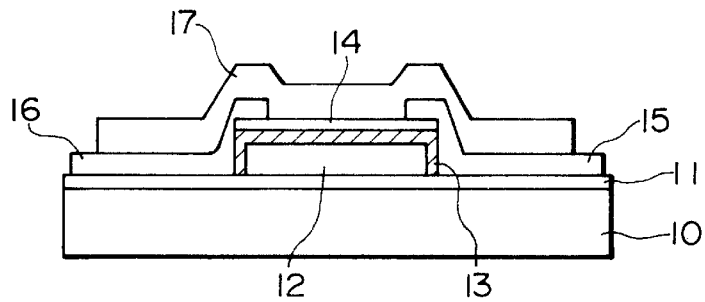
FIG. 1 is a sectional view of a conventional thin film transistor.
Figure 2A:
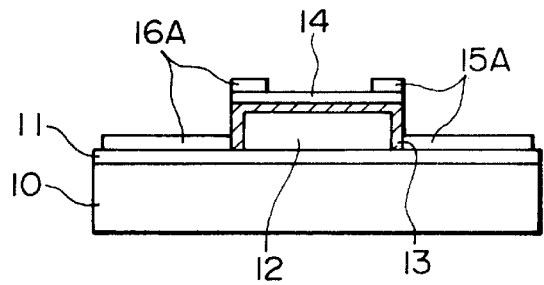
FIG. 2A is a sectional view of a conventional thin film transistor in which the source and drain electrode films become discontinuous because they are too thin.
Figure 2B:
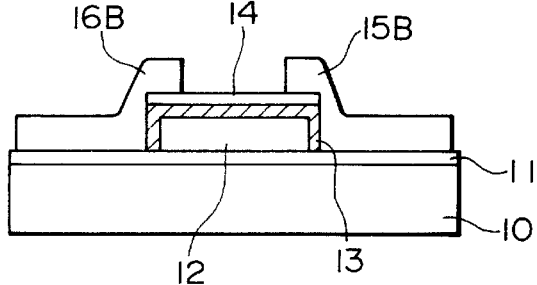
FIG. 2B is a sectional view of a prior art thin film transistor in which the source and drain electrodes are too thick and are easy to detach.
Figure 3:
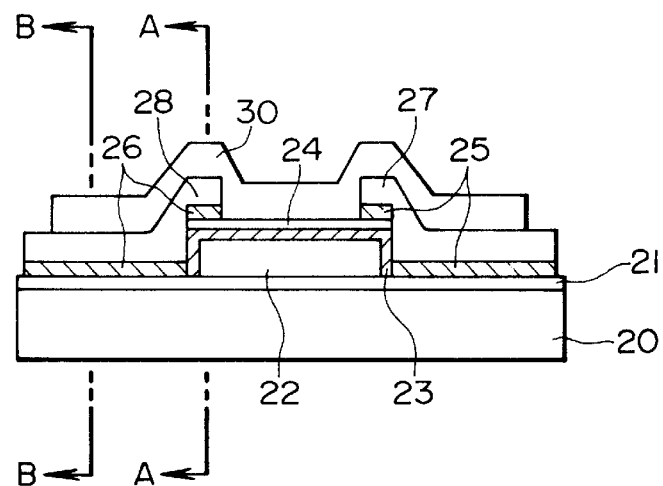
FIG. 3 is a sectional view of a thin film transistor according to an embodiment of the present invention.
Figure 4:
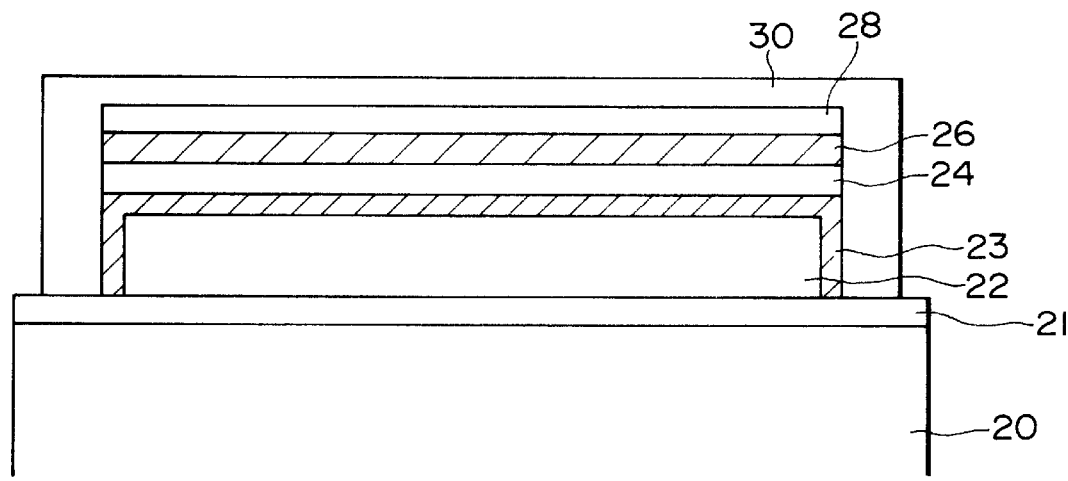
FIG. 4 is a sectional view, along A–A', of the thin film transistor of FIG. 3.
Figure 5:
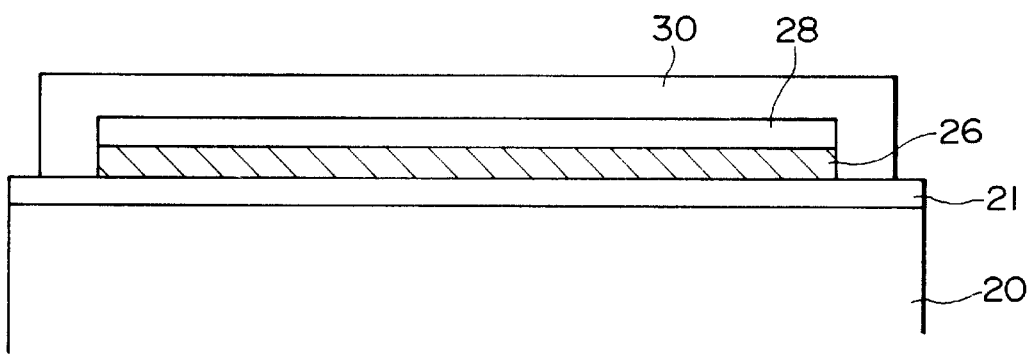
FIG. 5 is a sectional view, along B–B', of the thin film transistor of FIG. 3.
Figure 6A:
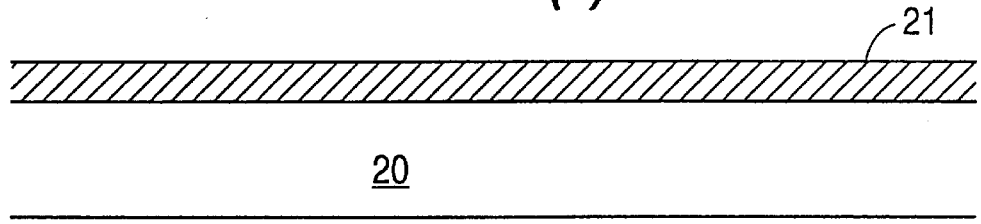
FIGS. 6(a)–(h) disclose the process sequence used to fabricate the thin film transistor of FIG. 3.
Figure 6B:
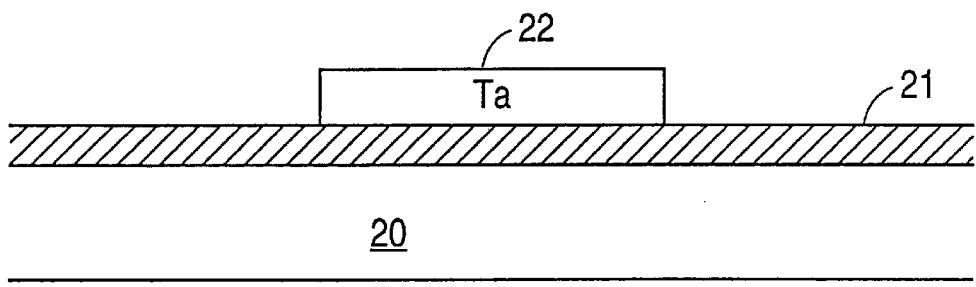
Figure 6C:
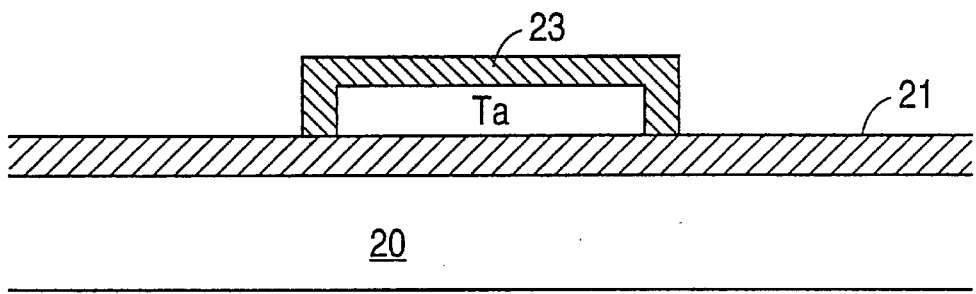

An embodiment of the present invention will be described with reference to FIG. 3 and FIGS. 6(a)–FIG. 6(h). An optional tantalum oxide ($Ta_2O_5$) film is formed, as a stop layer 21, on a glass substrate 20 as illustrated in FIG.6(a). A 2000 Å thick tantalum (Ta) film for forming a gate electrode 22 is formed on the stop layer 21 by sputtering, as shown in FIG. 6(b). The Ta film is formed into a gate electrode 22 by being patterned with an etching solution. Then, the necessary portion of the gate electrode 22 is subjected to anodic oxidation (FIG. 6(c)) in an electrolyte of boric acid ammonium solution, to form a 1300 Å thick $Ta_2O_5$ film which is employed as a gate insulating film 23.

Figure 6D:
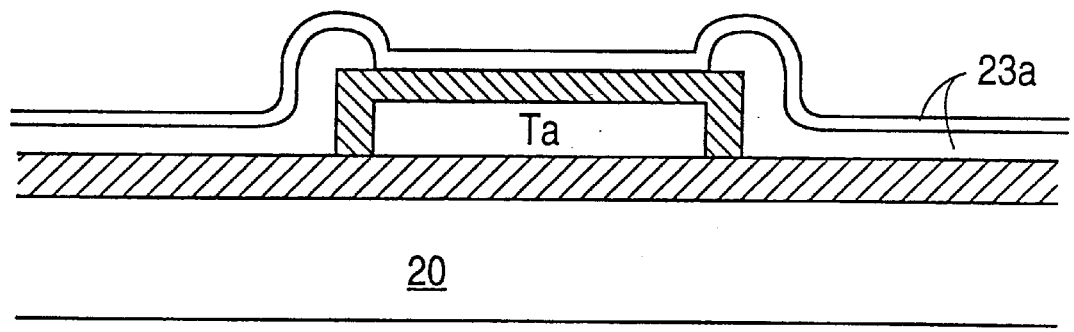

A semiconductor pattern is formed using a lift-off mask 23a from an ordinary photoresist and tellurium (Te), tintelluride or leadtelluride is vacuum-deposited, as a semiconductor film to a thickness of 30 to 100 Å as shown in FIG. 6(d).

Figure 6E:
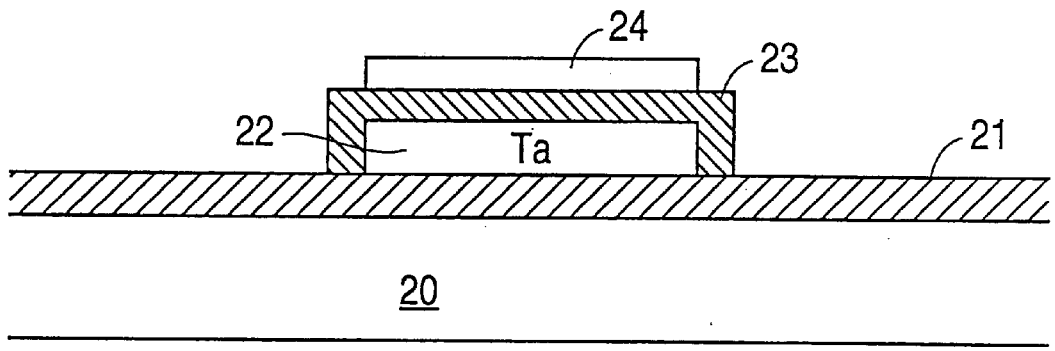
Figure 6F:
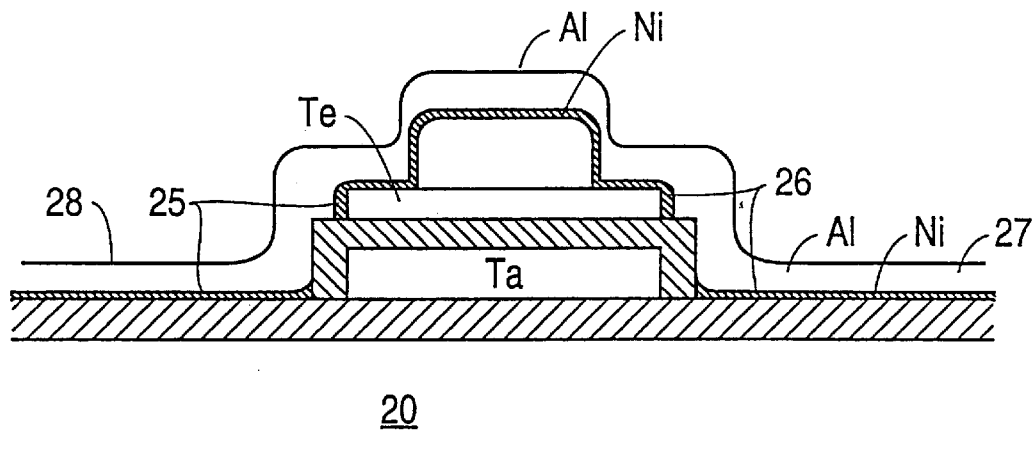

Thereafter, a semiconductor film 24 having the desired pattern is obtained by removing the photoresist mask as illustrated in FIG. 6(e).

Figure 6G:
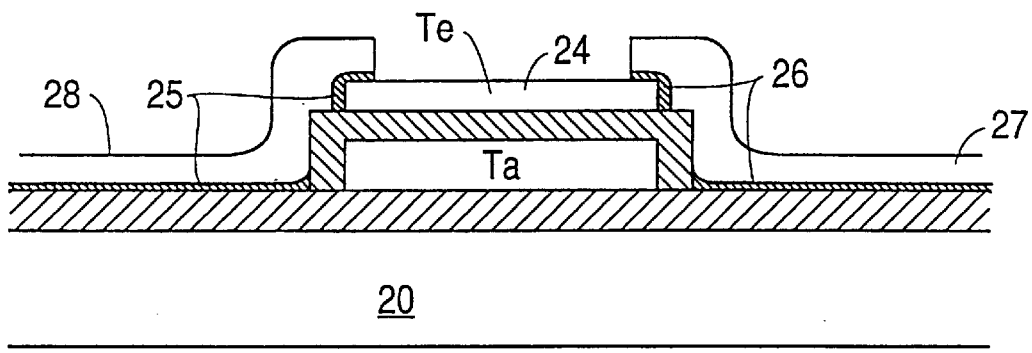
Figure 6H:
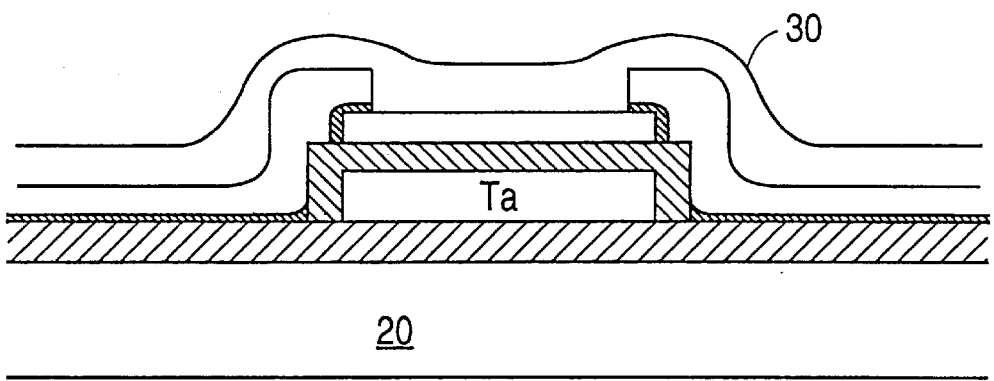

Next, a lift-off mask for forming source and drain electrodes is formed. Under this condition nickel (Ni) is vacuum-deposited, as a first layer, to a thickness of 200 Å, forming source and drain electrodes 25 and 26 see FIG. 6(F). A second layer of Al (27 and 28) is then vacuum deposited to a thickness of 3000 Å in the same vacuum chamber, in order to eliminate the discontinuous drain/source effect caused by the step of the gate electrode (22 and 23). In forming the source and drain electrode films (25, 26, 27 and 28), the substrate may be at a relatively low temperature (for example about 100° C.). The source and drain electrodes (25 through 28) are thereafter formed by removing the resist film as illustrated in FIG. 6(g). Finally, as shown in FIG. (h) $Al_2O_3$ is vacuum-deposited to a thickness of 3000 Å to form a protective film 30. Thus, the thin film transistor of FIG. 3 has been manufactured.

The above-described electrode structure permits the formation of excellent source and drain electrodes (25 through 28) which are continuous and free from adhesion problems. The manufactured thin film transistor has excellent reproducibility and stability characteristics.

In the above-described embodiment, the semiconductor is Te, the first layer film for the source and drain electrodes is of Ni, and the second layer film is of Al. As would be recognized by one of skill in the art, other materials can provide the same effects if they satisfy the condition that the first layer film provides sufficient ohmic contact with the semiconductor and the second layer film provides sufficient adhesion strength even when the substrate is at a relatively low temperature during the deposition of the source and drain electrodes. In the above-described embodiment, the thin film transistor is formed on a glass substrate; however, it should be noted that the technical concept of the invention is effective in overcoming the above-described problems even in, the case where a thin film transistor is formed on a silicon (Si) substrate or a sapphire ($Al_2O_3$) substrate.

The many features and advantages of the invention are apparent from the detailed specification and thus it is intended by the appended claims to cover all such features and advantages which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. A method of forming a thin film transistor on a substrate, comprising the steps of:
    (a) forming a gate electrode on a substrate;
    (b) oxidizing the gate electrode to form a gate insulating film on the gate electrode, the gate electrode and the gate insulating film forming a step;
    (c) forming a thin film semiconductor on the gate insulating film; and
    (d) forming a source and drain electrode film laminate on the thin film semiconductor, including the sub-steps of
        (i) forming a resist film on a first portion of the thin film semiconductor to provide a lift-off mask,
        (ii) forming, while the substrate is at a temperature less than the temperature corresponding to the vapor pressure of the material of the thin film semiconductor, a first layer film portion of the source and drain electrode film laminate on the resist film and on exposed portions of the thin film semiconductor and in ohmic contact with the thin film semiconductor, the first layer film portion having a mesh structure,
        (iii) forming a second layer film portion of the source and drain electrode film laminate on the first layer film portion and in contact with the thin film semiconductor through the mesh structure of the first layer film portion, the second layer film portion having a greater adhesion strength than the first layer film portion, reinforcing the first layer film portion and having a thickness sufficient to provide a continuous film across the step, and
        (iv) removing the lift-off mask from the first portion of the thin film semiconductor.

2. A method as recited in claim 1, wherein:
    the thin film semiconductor includes tellurium; and
    the temperature of the substrate in sub-step (ii) is below about 100° C.

3. A method as recited in claim 2, wherein:
    the first layer film portion includes nickel; and
    the second layer film portion includes aluminum.

4. A method as recited in claim 1, wherein the first portion of the thin film semiconductor is located between and separates a source electrode and a drain electrode formed by the source and drain electrode film laminate when the lift-off mask is removed in sub-step (iv).

5. A method of forming a thin film transistor on a substrate, comprising the steps of:
    (a) forming a gate electrode on a substrate;
    (b) oxidizing the gate electrode to form a gate insulating film on the gate electrode, the gate electrode and the gate insulating film having a step;
    (c) forming a thin film semiconductor on the gate insulating film; and
    (d) forming a source and drain electrode film laminate composed of oxidation-resistant metal on the thin film semiconductor, including the sub-steps of
        (i) forming a resist film on a first portion of the thin film semiconductor to provide a lift-off mask,
        (ii) forming, while the substrate is at a temperature less than the temperature corresponding to the vapor pressure of the material of the thin film semiconductor, a first layer film portion of the source and drain electrode film laminate on the resist film and on exposed portions of the thin film semiconductor and in ohmic contact with the thin film semiconductor, the first layer film portion having a mesh structure and being made of a metal having an ohmic contact capability,
        (iii) forming, while the substrate is at a temperature less than the temperature corresponding to the vapor pressure of the material of the thin film semiconductor, a second layer film portion of the source and drain electrode film laminate on the first layer film portion and in contact with the thin film semiconductor through the mesh structure of the first layer film portion, the second layer film portion being composed of a metal which is different from that of the first layer portion and which has a higher adhesion strength than the first layer film portion, the second layer film portion reinforcing the first layer film portion and having a thickness sufficient to provide a continuous film across the step, and
        (iv) removing the lift-off mask from the first portion of the thin film semiconductor.

6. A method as recited in claim 5, wherein the thin film semiconductor includes tellurium and the temperature of the substrate in sub-step (ii) is below about 100° C.

7. A method as recited in claim 5, wherein the first portion of the thin film semiconductor is located between and separates a source electrode and a drain electrode formed by the source and drain electrode film laminate when the lift-off mask is removed in sub-step (iv).

8. A method as recited in claim 5, wherein:

the first layer film portion includes nickel; and the second layer film portion includes a material selected from a group consisting of aluminum, titanium and tantalum.

* * * * *